(12) United States Patent
Hashimoto

(10) Patent No.: US 6,709,799 B2
(45) Date of Patent: Mar. 23, 2004

(54) RESIST COMPOSITIONS

(75) Inventor: Kazuhiko Hashimoto, Tsukuba (JP)

(73) Assignee: Sumitomo Chemical Company, Limited, Osaka (JP)

(*) Notice: Subject to any disclaimer, the term of this patent is extended or adjusted under 35 U.S.C. 154(b) by 0 days.

(21) Appl. No.: 09/742,084

(22) Filed: Dec. 22, 2000

(65) Prior Publication Data
US 2001/0018161 A1 Aug. 30, 2001

(30) Foreign Application Priority Data

Dec. 27, 1999 (JP) .......................... 11-370690

(51) Int. Cl.[7] .............................. G03C 1/73; G03F 7/038
(52) U.S. Cl. ............................ 430/270.1; 430/286.1; 430/287.1; 430/325; 430/905; 430/909; 430/910
(58) Field of Search ................... 430/270.1, 286.1, 430/287.1, 325, 326, 905, 909, 910, 914

(56) References Cited

U.S. PATENT DOCUMENTS

| 6,168,909 | B1 | * | 1/2001 | Katsuyama | 430/326 |
| 6,300,035 | B1 | * | 10/2001 | Thackeray et al. | 430/270.1 |
| 6,475,706 | B1 | * | 11/2002 | Kishimura et al. | 430/325 |
| 6,528,232 | B1 | * | 3/2003 | Maeda et al. | 430/270.1 |
| 2002/0081520 | A1 | * | 6/2002 | Sooriyakumaran et al. | 430/270.1 |

* cited by examiner

Primary Examiner—Janet Baxter
Assistant Examiner—Sin J. Lee
(74) Attorney, Agent, or Firm—Birch, Stewart, Kolasch & Birch, LLP

(57) ABSTRACT

There is provided a resist composition containing a photosensitive resin and used in photolithography, said photosensitive resin having a transmittance of 40% or more for a light having a wavelength of 157 nm in applying to a thickness of 0.1 $\mu$m. The composition has a characteristic that it allows easy formation of a fine pattern having a good profile, particularly at a wavelength for exposure with an F2 excimer laser.

7 Claims, 1 Drawing Sheet

RESIST COMPOSITIONS

BACKGROUND OF THE INVENTION

1. Field of the Invention

The present invention relates to a resist composition. The present invention relates to a resist composition which allows formation of a fine resist pattern by exposing to an ultraviolet radiation, particularly a vacuum ultraviolet radiation (hereinafter, may be referred to as VUV radiation).

2. Description of Related Art

In recent years, the wiring has become finer and more multiple-layered with advanced high-integration of semiconductor devices. For the manufacture of the next generation semiconductor devices with advanced high integration, use of VUV radiation has become investigated as a light source for exposure in the lithography technique for fine processing. Particularly, use of a light having a wavelength of 157 nm, which is an F2 excimer laser radiation, in lithography has been investigated.

A problem arises by using such shortening in the wavelength of light source, however, that resist materials proposed for use in lithography using KrF excimer laser radiation or ArF excimer radiation have usually a low transmittance to VUV radiations such as a radiation of 157 nm and do not allow realization of a high resolution.

Since these conventional resist materials have a low transmittance to VUV radiation such as a radiation of 157 nm, they do not transmit sufficiently the light to the bottom when they have a practically used thickness. Therefore, there has been a problem that their use in the process for semiconductor production is difficult because a good pattern can not be formed.

An object of the invention is to solve the problem in the conventional techniques as described above and to provide a resist composition which enables realization of an excellent resolution when a VUV radiation exemplified by an F2 excimer laser light is used.

As the result of extensive studies conducted for solving the above problem, the present inventors have found that the above object can be attained when the transmittance of the photosensitive resin to be used for a light having a wavelength of 157 nm is a specific value or above. They have conducted further studies based on such finding and successfully completed the invention.

SUMMARY OF THE INVENTION

The present invention relates to a resist composition containing a photosensitive resin and used for photolithography, wherein said photosensitive resin has a transmittance of 40% or more for a light having a wavelength of 157 nm in applying to a thickness of 0.1 μm.

DETAILED DESCRIPTION OF THE INVENTION

Figure 1:
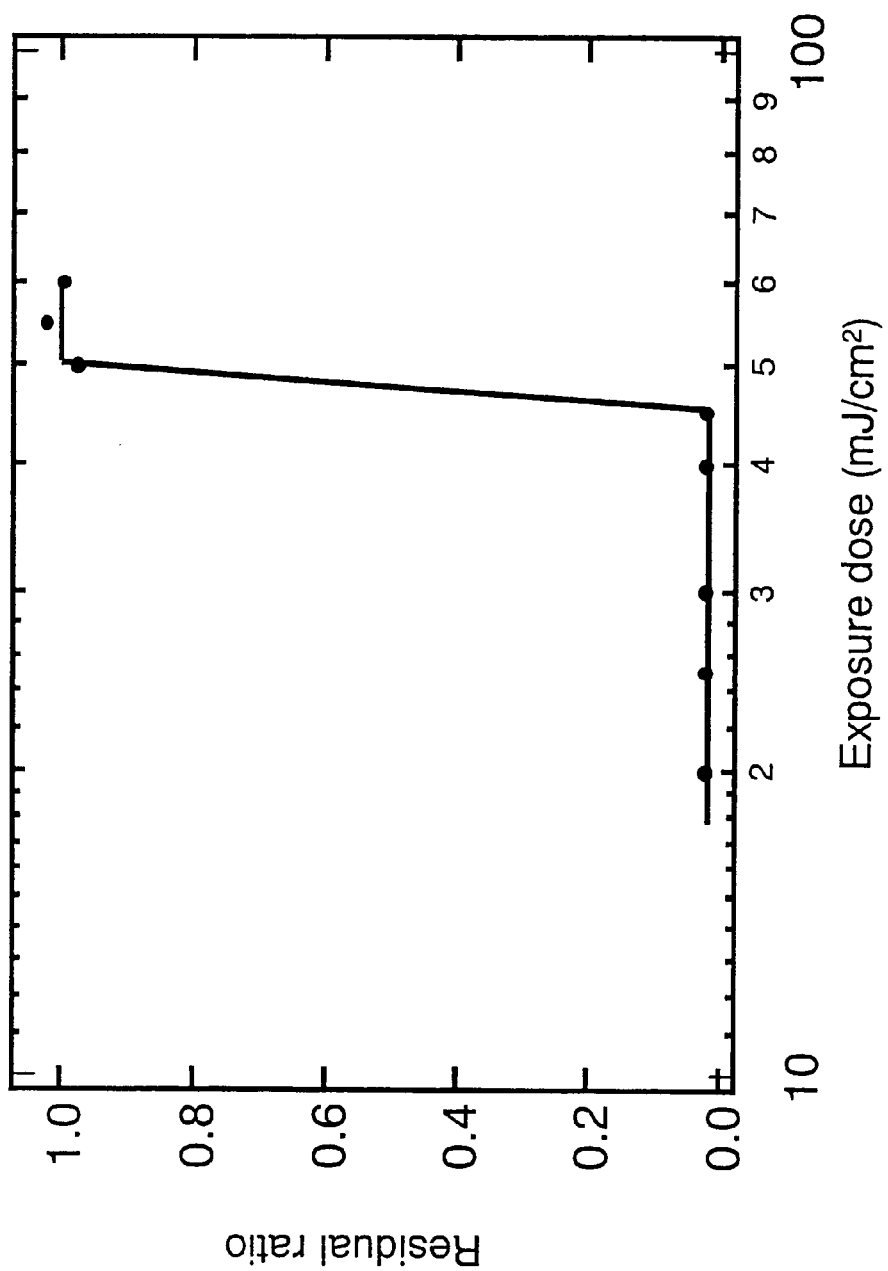
FIG. 1 shows a graphic representation showing the residual ratio after development plotted against the exposure.

The present invention will be described below in more detail.

The resist composition of the invention is a resist composition containing a photosensitive resin and used in photolithography, characterized in that it comprises a photosensitive resin having a transmittance of 40% or more for a light with a wavelength of 157 nm in applying to a thickness of 0.1 μm.

The photosensitive resin here refers to a resin which can be changed in the physicochemical properties by its optically responsible function and specifically includes a resin having a photodegradable group, a resin having a photosensitive cross-linking group, a resin of which the solubility characteristics in a developing solution varies by a photosensitive compound and a resin which reacts with a cross-linking agent by a photosensitive compound.

The photosensitive resin used in the invention is a resin having a transmittance of 40% or more at 157 nm in applying to a thickness of 0.1 μm. When the transmittance is less than 40%, the resist has inferior performances including the profile, contrast, sensitivity and the like.

Specific examples of the photosensitive resin used in the invention include a carbon polymer, a fluorine polymer, a silicon polymer and the like.

Said photosensitive resin has a molecular weight preferably of 1,000 to 100,000 and more preferably of 3,000 to 30,000. Its degree of dispersion is preferably 1.0 to 4.0 and more preferably 1.0 to 3.0.

The resist composition provided by the invention can be suitably used either as a positive type or as a negative type. In addition, the composition can be suitably used either as a chemical amplification type resist or as a non-chemical amplification type resist.

When the composition is used as a negative type photosensitive resist composition, it is preferred that the composition contains an alkali-soluble resin having a functional group that is cross-linked by a vacuum ultraviolet radiation. Specifically, such resin contains, for example, a phenol group, a carboxyl group or the like an alkali-soluble group and a chloromethyl group, a vinyl group, an allyl group or the like as a photosensitive cross-linking group in the structure of the resin.

When the composition is used as a negative type chemical amplification photosensitive resist composition, the composition may contain a compound which generates an acid by a vacuum ultraviolet radiation, an alkali-soluble resin and a compound which cross-links an alkali-soluble resin by the acid. Specific examples of the acid-generating agent include compounds described in JP-A-11-202495 such as diphenyliodonium trifluoromethanesulfonate, 4-methoxyphenylphenyliodonium hexafluoroantimonate, 4-methoxyphenylphenyliodonium trifluoromethanesulfonate, bis(4-tert-butylphenyl)iodonium tetrafluoroborate, 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, diphenyl disulfone, di-p-tolyl disulfone, phenyl p-tolyl disulfone, bis (phenylsulfonyl)diazomethane, bis(4-chlorophenylsulfonyl) diazomethane, bis(p-tolylsulfonyl)diazomethane, 1-benzoyl-1-phenylmethyl p-toluenesulfonate (common name: benzoin tosilate), 2-benzoyl-2-hydroxy-2-phenylethyl p-toluenesulfonate (common name: α-methylolbenzointosilate), 1,2,3-benzenetriyl trismethanesulfonate, 2,6-dinitrobenzyl p-toluenesulfonate, 2-nitrobenzyl p-toluenesulfonate, 4-nitrobenzyl p-toluenesulfonate, N-(phenylsulfonyloxy)succinimide, N-(p-tolylsulfonyloxy)succinimide, N-(trifluoromethylsulfonyloxy)succinimide, N-(isopropylsulfonyloxy)succinimide, N-(n-butylsulfonyloxy)succinimide, N-(n-hexylsulfonyloxy)

succinimide, N-(10-camphorsulfonyloxy)succinimide, N-(trifluoromethylsulfonyloxy)phthalimide, N-(trifluoromethylsulfonyloxy)-5-norbornene-2,3-dicarboxy imide, and the like. Examples of the compound which cross-link the alkali-soluble resin by the action of an acid include methylol melamine, methoxymethylol melamine, dimethylated methylol urea, 1,3-bis(methoxymethyl)ethyleneurea, 1,3-bis(hydroxymethyl)-4,5-bis(hydroxy)ethyleneurea, 1,3-bis(hydroxymethyl)-tetrahydro-2(1H)pyrimidinone, dimethylol urone, 1,3,4,6-tetrakis(hydroxymethyl)glycol uryl, 1,3,4,6-tetrakis(methoxymethyl)glycol uryl, and the like.

In addition, when the composition is used as a positive type chemical amplification photosensitive resist composition, it is preferred that the composition contains a compound which generate an acid by a vacuum ultraviolet radiation and a resin which degrades by the acid so that its velocity of dissolution in an aqueous alkali solution increases. Specific examples of the acid-generating agent include compounds described in JP-A-11-202495 as mentioned above.

The resin which degrades by the acid so that its velocity of dissolution in an aqueous alkali solution increases include a resin having, in the structure of said resin, for example, a phenol group, a carboxyl group or the like and a group in which a hydrogen atom in such group is replaced by a group which dissociates by the action of the acid, as the alkali-soluble group. Examples of the replacing group include t-butoxycarbonyl group, t-butoxycarbonylmethyl group, trimethylsilyl group, tetrahydropyranyl group, ethoxyethyl group, ethoxypropyl group, propyloxyethyl group, t-butyl group and the like.

The solvent is preferably one which sufficiently dissolves components usually used in resists such as the polymer, the photosensitive compound and other additives, and which gives a uniformly expanded resist film. Specific examples include ethylene glycol methyl ether acetate, ethylene glycol ethyl ether acetate, propylene glycol methyl ether acetate, propylene glycol ethyl ether acetate, ethyl acetate, butyl acetate, isoamyl acetate, n-butyl acetate, γ-butyrolactone, ethylene glycolmonomethyl ether, diethylene glycol monomethyl ether, ethylene glycol monoethyl ether, diethylene glycol dibutyl ether, diethylene glycol dimethyl ether, propylene glycol monomethyl ether, propylene glycol monoethyl ether, cyclohexanone, methyl ethyl ketone, methyl isobutyl ketone, methyl amyl ketone and the like. These solvents can be used independently of each other or in combination of two or more. The amount of the solvent to be contained is preferably 5 to 100 times the weight of components, other than the solvent, used in the resist.

In addition to the above-described components, the resist composition of the invention may contain film-improvement agent such as surfactant or others, if necessary.

The resist composition of the invention is useful in fine processing with an ultraviolet radiation such as VUV. It has a characteristic that it allows easy formation of a fine pattern having a good profile, particularly at a wavelength for exposure with an F2 excimer laser.

EXAMPLES

The present invention will now be specifically described with reference to appended Examples, which should not be construed as a limitation upon the scope of the invention.

Example 1

Into a four-necked flask equipped with a reflux condenser and a thermometer were charged 9.2 g of 1,3-bis(carboxypropyl)tetramethyldisiloxane, 84 ml of pure water, 8.4 ml of concentrated hydrochloric acid and 320 ml of tetrahydrofuran and the mixture was heated to the reflux temperature. To this mixture was added dropwise 12.5 g of tetraethoxysilane over 30 minutes and they were reacted for 1 hour. Then, 12.4 g of tetrahydrofuran was added, followed by dropwise addition of 10.4 g of tetraethoxysilane over 30 minutes. They were reacted for 1 hour. The reaction solution was cooled to room temperature, concentrated and dissolved in a large amount of methyl isobutyl ketone (hereinafter, may be abbreviated as MIBK).

The solution was washed with water in a separating funnel and the organic layer was dehydrated by azeotropic distillation. After adding 90 g of MIBK and 0.28 g of pyridine, the mixture was stirred and heated to 70° C. Then, 1.0 g of chloromethylphenylethyl dimethyl chlorosilane was added dropwise to the mixture and they were reacted for 2 hours. After allowing cooling to room temperature, the obtained solution was filtered. While stirring the filtrate at room temperature, 8.0 g of trimethylsilylimidazole was added dropwise and they were reacted for 2 hours. The reaction solution was combined with 12 ml of hydrochloric acid and filtered. The filtrate was transferred into a separating funnel and washed with water until the aqueous layer was neutral. The organic layer was dehydrated by azeotropic distillation and concentrated. Higher molecular components were removed by separating with toluene. The product was lyophilized with dioxane to give the desired silicon-containing polymer having a molecular weight of 8,000 and a degree of dispersion of 1.7.

A MIBK solution of the polymer was spin coated on a MgF$_2$ substrate and baked at 110° C. for 60 seconds to give a specimen.

The obtained polymer had a transmittance of 43% at 157 nm (converted to a thickness of 0.1 μm).

Example 2

A resist solution for an upper layer of two-layer resist was prepared by dissolving the resin alone in Example 1. Onto a silicon wafer was spin coated a novolak resist solution (PFI-38A4, manufactured by Sumitomo Chemical Ind.). Then, the wafer was baked on a hot plate at 250° C. for 30 minutes to obtain a lower layer resist film having a thickness of 0.5 μm. Subsequently, the resist solution for upper layer prepared before was rotationally applied on the lower layer resist film and pre-baked at 110° C. for 60 seconds to form an upper layer resist film of 0.136 μm. After exposing the upper layer resist film to an F2 excimer laser light, the film was subjected to development with 0.238% aqueous tetramethyl ammonium hydroxide (TMAH) solution. As the result, a sensitivity curve having a high contrast, as shown in FIG. 1, was obtained.

What is claimed is:

1. A resist composition containing a photosensitive resin and used for photolithography, wherein said photosensitive resin has a transmittance of 40% or more for a light having a wavelength of 157 nm in applying to a thickness of 0.1 μm, and wherein the resist composition is a negative type photosensitive resin composition containing an alkali-soluble resin having a functional group which is cross-linked by a vacuum ultraviolet radiation.

2. The resist composition according to claim 1, wherein the photosensitive resin has a molecular weight of 3,000 to 30,000.

3. The resist composition according to claim 1, wherein the degree of dispersion of the photosensitive resin is 1.0 to 4.0.

4. A resist composition containing a photosensitive resin and used for photolithography, wherein said photosensitive resin has a transmittance of 40% or more for a light having a wavelength of 157 nm in applying to a thickness of 0.1 μm, and wherein said photosensitive resin is a resin containing an alkali-soluble group and a photosensitive cross-linking group in the structure of the photosensitive resin, and having a negative type photosensitivity.

5. The resist composition according to claim 4, wherein the alkali-soluble group is a phenol group or a carboxyl group and the photosensitive cross-linking group is chloromethyl group, vinyl group or allyl group.

6. The resist composition according to claim 4, wherein the photosensitive resin has a molecular weight of 3,000 to 30,000.

7. The resist composition according to claim 4, wherein the degree of dispersion of the photosensitive resin is 1.0 to 4.0.

* * * * *